United States Patent

Muff et al.

(10) Patent No.: US 6,894,525 B2
(45) Date of Patent: May 17, 2005

(54) METHOD AND DEVICE FOR TIME MEASUREMENT ON SEMICONDUCTOR MODULES EMPLOYING THE BALL-GRID-ARRAY TECHNIQUE

(75) Inventors: Simon Muff, Mering (DE); Abdallah Bacha, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/772,356

(22) Filed: Feb. 6, 2004

(65) Prior Publication Data

US 2004/0251926 A1 Dec. 16, 2004

(30) Foreign Application Priority Data

Feb. 7, 2003 (DE) .......................... 103 05 116

(51) Int. Cl.[7] .............................. G01R 31/26
(52) U.S. Cl. ................... 324/765; 324/158.1
(58) Field of Search .................. 324/765, 754, 324/158.1, 72.5, 763, 532, 537, 535, 637, 642; 368/113, 118; 333/17.1; 438/14, 17, 18; 257/48

(56) References Cited

U.S. PATENT DOCUMENTS 6,566,751 B1   5/2003  Yun
6,639,393 B2 * 10/2003 Tasker et al. ............ 324/76.19
6,703,844 B2 *  3/2004 Adler et al. ................ 324/637
6,750,672 B2    6/2004 Tanimura et al.

FOREIGN PATENT DOCUMENTS

DE    100 07 434 A1   11/2000
DE    102 14 148 A1    2/2003

* cited by examiner

*Primary Examiner*—David Zarneke
*Assistant Examiner*—Jimmy Nguyen
(74) *Attorney, Agent, or Firm*—Slater & Matsil, L.L.P.

(57) ABSTRACT

A method and a device for time measurement at a designated signal pin or associated solder pad on a semiconductor module on which semiconductor chips are mounted using the ball-grid-array technique. Integrated on the semiconductor module in the direct vicinity of a solder pad associated with the signal pin to be measured is an equivalent conductor pattern, which can be loaded with passive components in such a way that, in the loaded state, it forms an equivalent load circuit for the designated signal pin which simulates the time-relevant characteristic electrical values of the designated signal pin. The measurement takes place after connection of the ELC to a solder pad associated with the signal pin, with the semiconductor chip detached from the semiconductor module.

17 Claims, 2 Drawing Sheets

METHOD AND DEVICE FOR TIME MEASUREMENT ON SEMICONDUCTOR MODULES EMPLOYING THE BALL-GRID-ARRAY TECHNIQUE

BACKGROUND

1. Field of the Invention

The invention relates to semiconductor measurements and more particularly to a method and a device for the time measurement of signals at pins or solder pads of semiconductor memory chips.

2. Background of the Invention

In semiconductor memory modules provided with registers, capacitive loads are buffered to a memory sub-channel bus and boosted again. A PLL circuit is used for refreshing a clock signal, while clocked buffer registers are used for refreshing command and address signals (CMD-ADR bus).

In order to maintain proper operation, it must be ensured that a clock signal reaches all parts of a memory module that relate the control of its timing to the system clock in a special time frame, that is, the PLL circuit itself, the registers, and DRAM semiconductor memory chips. For certain DDR memory modules that are operated with a differential clock signal at 133 MHz, the time frame is approximately −100 to +100 ps.

Since Process/Voltage/Temperature (PVT) variations of the parts concerned exert a strong influence on clock jitter of the PLL circuit and the amplification of the driving amplifiers, for each individual memory module the influence of loading of the DRAM semiconductor memory chips and the registers on the cut-off level of the positive and negative clock signals must be measured by a special time measurement technique to ensure that the clock signal arrives within the specified time frame.

In earlier conventional semiconductor chips, the leads or pins of which protrude laterally (for example so-called TSOP chip types), signals for time measurement mentioned above can be derived directly from the pins by means of a suitable measuring probe.

With the increasing operating speed of second generation DRAM memory modules (DDR-II modules), which operate at a clock frequency of up to 266 MHz, the so-called ball-grid-array (BGA) technique has been increasingly employed. The BGA technique produces better characteristic electrical values, including for example, smaller parasitic inductances. This type of chip packaging and contacting is used for PLLs, registers and DRAM chips, where all the pins lie under the chip body itself. In most cases the solder pads of the module (e.g., a DIMM board) that are assigned to the pins are located under the chip body itself, so that they cannot be reached by a measuring probe, or can be reached only with the aid of certain auxiliary measures, for time measurement.

Previously, the following known methods have been employed to overcome these difficulties in the case of modules that are loaded or can be loaded with semiconductor chips using the ball-grid-array technique:

1. On modules that are loaded with components on one side, in which the components are located only on one side of a printed circuit board, access to the signal lines can be ensured by a plated-through hole (via), which leads from a loaded side of the module to the other, unloaded side, and is arranged as close as possible to the terminal (ball) of the semiconductor chip that is to be tested. However, this method has the disadvantage that a mask protecting the plated-through hole has to be removed before the measurement, so that the circuit design has to be split into a measurable part with open plated-through holes, and a part intended for sale with protected plated-through holes. Furthermore, semiconductor modules that are loaded with components on both sides cannot be measured in this way, since they do not have any space for the respective plated-through holes to the other side of the module.

2. On semiconductor modules that are loaded with components on two sides, the layout is supplemented by special test points, which allow the measuring probe to have direct access. These test points must lie as close as possible to the solder pad of the pin concerned (ball) that is to be tested or measured. The disadvantage of this method is that not all relevant signals can be accessed, since very densely loaded modules with an extremely high conductor density do not have the additional space for these test points. Furthermore, the capacitive load is changed by the added test points and the short conductor connections to them.

Tests have shown that the two methods referred to above differ only very little with regard to their measuring accuracy.

3. Another measure employed is that of soldering socket-like measuring adapters between the chip and the semiconductor module. This requires very great effort, and such adapters also appreciably influence the measured values.

4. A final measure employs soldering so-called wire adapters between a signal pin of the semiconductor chip and an assigned solder pad on the semiconductor module. A measuring probe can pick up the signal that is to be measured at the free end of the wire. The wire adapter must have insulation on the underside, so that no unwanted connection to underlying conductor tracks is established. This method has the disadvantage, however, that it cannot be used in the case of all chips on a module and that the heat produced during the soldering often destroys the wire adapter, which makes the entire module unusable.

In view of the foregoing, it will be appreciated that there is a need to further improve time measurements associated with modem semiconductor chip packaging.

SUMMARY

Embodiments of the present invention provide a time-measuring method and a simple and low-cost time-measuring device adapted for it so that harmful influences on signals to be measured can be suppressed; and the electrical properties of the time-measuring device are adapted to the specified characteristic values of the signal pin to be measured, and simple contacting by a suitable measuring probe is possible.

In an exemplary embodiment of the present invention, a time-measuring method involves spatially assigning an equivalent conductor pattern (ECP) to a signal pin or solder pad (both hereinafter also referred to as "inputs") to be measured. The ECP is integrated on the semiconductor module, and is loaded with passive components chosen such that, when the ECP is connected to the solder pad while the signal pin of the semiconductor chip is detached, an equivalent load circuit (ELC) resulting from the component loading simulates the characteristic electrical values specified for the signal pin with the semiconductor chip loaded and the ELC not connected. The time measurement is performed at the solder pad connected to the ELC with the signal pin of the chip detached.

According to another embodiment of the present invention, a time-measuring device for measuring signals at solder pads assigned to signal pins on a semiconductor chip module, includes an ECP integrated on the semiconductor module. The ECP is spatially assigned to the signal pin or solder pad to be measured and can be connected to the latter. Preferably, the form and electrical properties of the ECP are adapted to the time-relevant characteristic electrical values specified for the signal pin with the semiconductor chip loaded with components. Preferably the test device includes an ELC, which is formed by loading the ECP with passive components so that, when connected to the solder pad with the signal pin of the semiconductor chip detached, the device simulates the time-relevant characteristic electrical values specified for the signal pin with the semiconductor chip loaded with components and the ELC not connected. In the above manner, time measurement can be performed at the solder pad connected to the ELC with the signal pin of the semiconductor chip detached.

In preferred embodiments, the time-measuring method and time-measuring device may be advantageously used for time measurement of DIMM boards that can be loaded with DRAMs or DDR-DRAMs using the ball-grid-array technique.

In view of the fact that it is necessary for a ground reference potential to be picked off from the semiconductor module for each signal that is to be derived by the measuring probe from a signal pin or an associated solder pad, a time-measuring device according to an embodiment of the present invention advantageously makes it possible by a special design of the ECP that, after loading of the same with components, an electrical connection can be established with a reference ground pad provided by the ECP and located at a short distance from the solder pad assigned to the signal to be measured.

The above and further advantageous features of embodiments of the present invention including a time-measuring method and a time-measuring device are clarified further in the description which follows which relates to the accompanying drawings.

DETAILED DESCRIPTION OF THE PREFERRED EMBODIMENTS

The following list of reference symbols is used consistently in the discussion to follow.

| | |
|---|---|
| 1 | ECP |
| 1' | ELC |
| 2 | signal pin/solder pad |
| 3 | ground pin/solder pad |
| 5 | measuring probe |
| 11–22 | solder pads of the ECP 1 |
| R1, R2, R3, C1, C2, L | passive components |
| M | semiconductor module |
| a–d | spatial arrangements of the ECP 1 |

Figure 1:
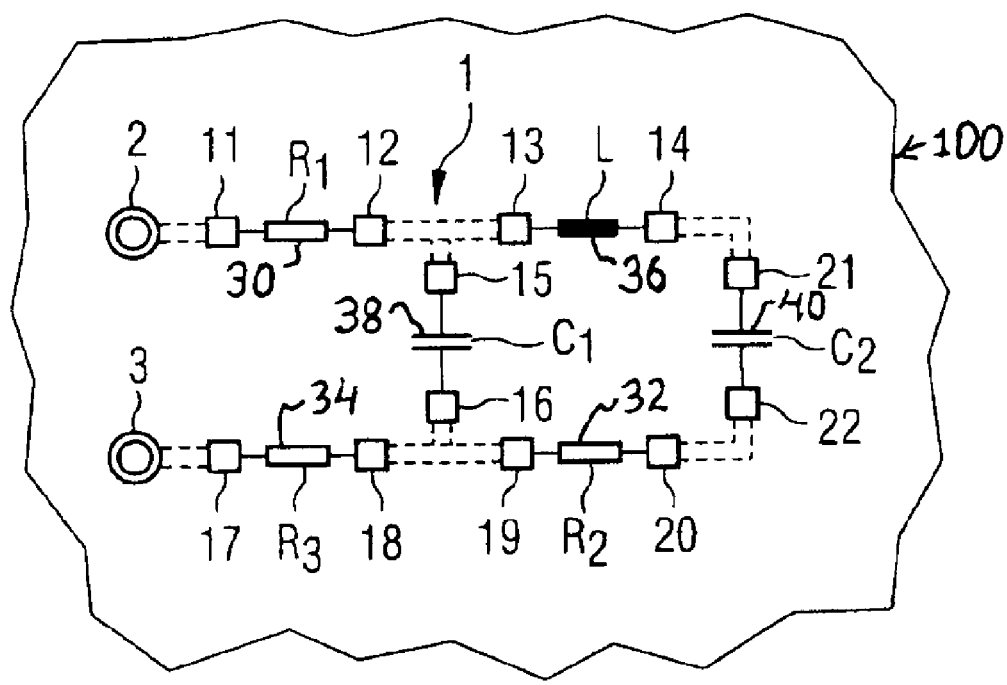
FIG. 1 illustrates a schematic layout view of an ECP, which is integrated on a semiconductor module board in spatial assignment to a designated signal pin (or its solder pad) that is to be measured and a reference ground pin or its solder pad.

FIG. 1 schematically depicts a view of a layout of an ECP that is integrated on a semiconductor module 100 and comprises a series of expediently arranged solder pads 11–22 and, if appropriate, connecting portions of conductor between the solder pads 11–22. The ECP can be loaded, for example, with the equivalent components shown in FIG. 2 in order to form an ELC 1', which simulates the time-relevant electrical properties of a signal pin at which a time measurement is to be performed. ECP 1 is located in the direct vicinity of a signal pin (ball) that is to be measured (not shown) or its solder pad 2, and a reference ground pin or associated solder pad 3 on the semiconductor module 100. The low-impedance electrical connection of the ECP 1 shown in FIG. 1, or ELC 1' may be fixedly provided, or may be established by small pieces of conductor that are subsequently soldered on during the loading of the ECP 1 with components. The same applies to the short pieces of conductor (depicted by dashed lines) between the individual solder pads 11–22 of the ECP 1.

According to FIG. 1, the illustrated arrangement of solder pads 11–22 forms a first and a second longitudinal branch, from solder pads 11–14 on the one hand, and 17–20 on the other hand. In addition, a first and a second transverse branch, respectively comprise solder pads 15, 16 and 21, 22. The first transverse branch, comprising solder pads 15 and 16, branches between the second and third solder pads 12, 13 and 18, 19 of the first and second longitudinal branches, respectively, while the second transverse branch adjoins the respective fourth solder pads 14, 20 of the first and second longitudinal branches.

Figure 2:
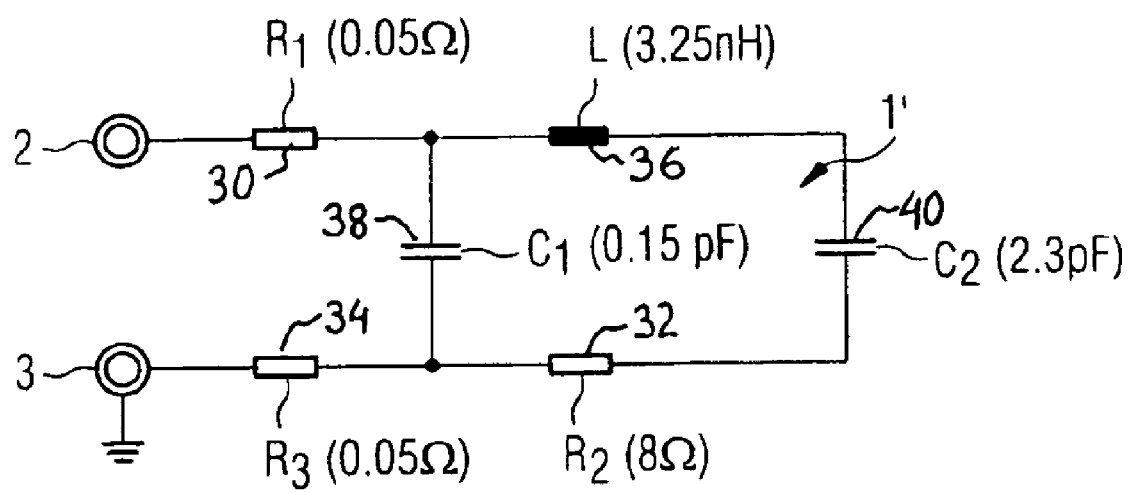
FIG. 2 schematically depicts an example of an equivalent circuit which shows components with which the ECP shown in FIG. 1 can be loaded, in order to produce an ELC for a DRAM designated signal pin.

Shown in FIGS. 1 and 2 is an example of how ECP 1 shown in FIG. 1 can be loaded with passive components 30 (R1), 32 (R2), 34 (R3), 36 (L), 38 (C1) and 40 (C2) to produce an ELC 1', which simulates the electrical properties of a signal pin or the assigned solder pad of a DRAM chip at which a time measurement is to be performed. The component loading shown in FIG. 2 is merely given by way of example and is not in any way to be considered as restrictive. The ECP shown in FIG. 1 is so flexible that virtually any time-relevant characteristic value of signal pins of DRAM semiconductor memory chips and of other semiconductor chips can be simulated. In this way, ELC 1' loaded with the components shown in FIG. 2, substitutes for a signal pin of a semiconductor chip, in particular a DRAM memory chip, that is to be measured, and advantageously also makes possible a spatially close and electrically low-impedance reference ground connection.

Figure 3:
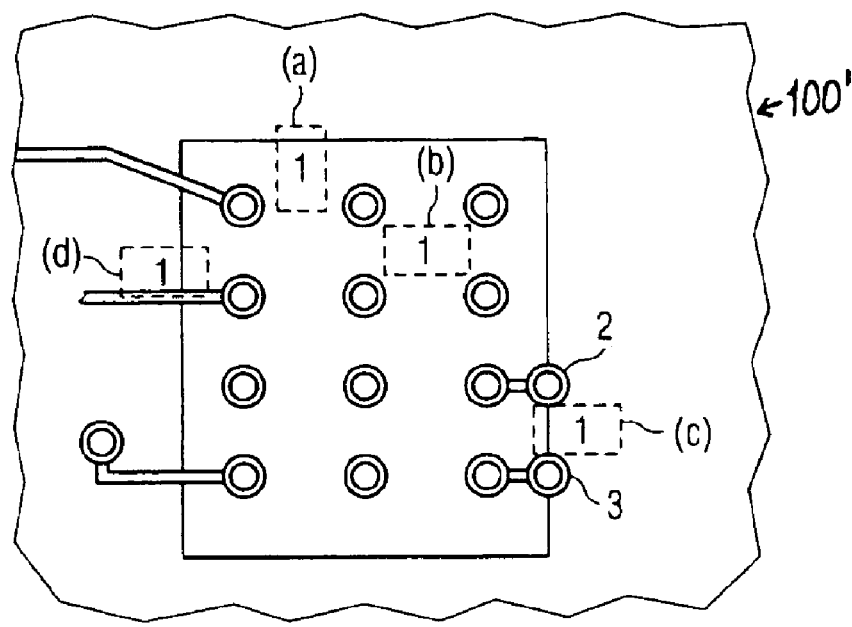
FIG. 3 schematically depicts a plan view of a ball-grid-array layout which is provided on a semiconductor module for the mounting of a chip using the ball-grid-array technique and in which various possible positions of the ECP shown in FIG. 1 are indicated.

FIG. 3, which shows a schematic plan view of a portion of a module 100' adapted for the mounting of a semiconductor chip, in particular a DRAM memory chip, merely illustrates by way of example various possible positions a–d at which the ECP 1 shown in FIG. 1 can be integrated on module 100'. From the aspect of the layout of the ECP 1 on semiconductor module 100', the only requirement is that it must lie in the direct vicinity of the signal pin to be measured or its solder pad 2, and of a pad 3 carrying reference ground, in order that the distance of the connection between the solder pads 11 and 17 and solder pads 2 and 3 is as short as possible. For example, as illustrated in FIG. 1, the distance of the connection between the solder pads 11 and 17 and solder pads 2 and 3 is significantly less than the separation of signal pad 2 from reference ground pad 3. For a time measurement at designated signal pins or associated solder pads carrying high-frequency clock signals, the spatial proximity of solder pad 3 carrying a reference ground, as made possible by the ECP 1 according to the invention, provides an exact time measurement not possible without such a ground reference point. FIG. 3 also shows that ECP 1 is integrated on semiconductor module 100' and is connected to solder pad 2 by the corresponding short conductor link between it and the first solder pad 11 or by the loading with the first resistor R1.

In an embodiment of the present invention for time measurement, the entire semiconductor chip is detached from the module 100' before or after ECP 1 is loaded with components to produce ELC 1' shown in FIG. 2 or another ELC 1' adapted to the time-relevant electrical properties of the designated signal pin or associated solder pad. Alternatively, only the designated signal pin may be detached. If appropriate, the electrical connection of ECP 1' to solder pad 2 assigned to the detached signal pin is also established. Subsequently, time measurement takes place at solder pad 2, connected to ELC 1', with respect to the reference ground lying at reference ground solder pad 3. By changing the values of the ELC 1' or the component loading of ECP 1, all the times which can occur as a result of the PVT variation of a DRAM can be specified and simulated, and semiconductor module 100' can be adjusted to an optimum value without measurement of different PVT materials of the DRAM.

Figure 4:
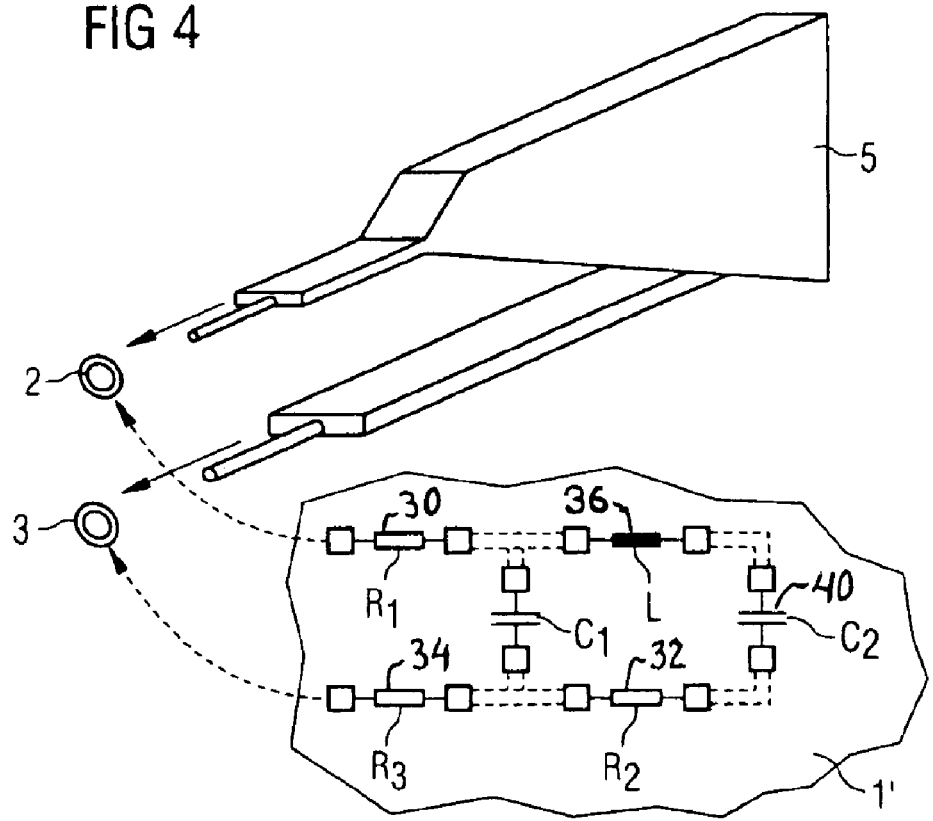
FIG. 4 schematically illustrates a measuring probe provided with a reference ground needle for the contacting of the signal and reference-ground solder pads according to FIGS. 1–3.

FIG. 4 schematically shows a signal pickup at solder pad 2 and the associated reference ground pad 3 by an adapted measuring probe 5, where solder pad 2, which, for example, carries a clock signal, and where reference ground solder pad 3 are both connected to an ELC 1', designed, for example, according to FIG. 2.

A time measurement can still be carried out at a semiconductor chip soldered on semiconductor module 100', since the ELC can be connected to the solder pad concerned in an electrically disconnectable manner. Furthermore, previously conventional test points can still be provided on the semiconductor module, so that a time measurement can also be performed at the latter test points.

As mentioned above, embodiments of the present invention provide, in particular, for time measurements on semiconductor modules, for example DIMM modules, which have semiconductor memory chips, registers and PLL chips mounted by means of the BGA technique and operate at a high clock frequency. Convenient access by a measuring probe to the signal pins that are to be measured is provided and falsification of measurement results or unreliable signal pickup from the signal pins in the case of BGA chips, can be eliminated.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for time measurement of a signal at an input for a semiconductor chip mounted on a semiconductor module, comprising:

spatially assigning an equivalent conductor pattern (ECP) to an input to be measured;

integrating the ECP on the semiconductor module;

loading the ECP with passive components to form an equivalent load circuit (ELC), wherein, when a designated signal pin is detached, the ELC simulates the characteristic electrical values specified for the designated signal pin with the semiconductor chip loaded and the ELC not connected; and performing a time measurement of the signal at a solder pad associated with the designated signal pin and connected to the ELC with the designated signal pin detached, wherein a signal is derived using a measuring probe in communication with at least one of the signal pin, a portion of conductor, and a solder pad directly connected to the latter at a short distance from it, and compared with a time reference.

2. The method of claim 1, wherein, during integration of the ECP, the ECP form and electrical properties are chosen such that the resulting ELC simulates specified characteristic electrical values.

3. The method of claim 1, wherein the specified characteristic electrical values are established by a previous measurement carried out at the designated signal pin or associated solder pad of the loaded semiconductor chip without connection to the ELC.

4. The method of claim 1, wherein the components used for the loading of the ECP are resistive and/or capacitive and/or inductive components.

5. The method of claim 1, wherein the ECP is formed such that, after component loading, the ECP establishes an electrical connection with a reference ground pad.

6. The method of claim 5, wherein the distance of the reference ground pad from the solder pad associated with the signal pin is chosen to coincide with the distance of a reference ground needle from a signal measuring needle of the measuring probe.

7. The method of claim 1, wherein the semiconductor chip is a semiconductor chip that can be mounted using the ball-grid-array (BGA) technique.

8. A device for time measurement of signals at a solder pad associated with a designated signal pin of a semiconductor chip to be mounted on a semiconductor module, comprising:

an equivalent conductor pattern (ECP) integrated on the semiconductor module, wherein the ECP is spatially assigned to at least one of the designated signal pin and an associated solder pad to be measured, and wherein a form and electrical properties of the ECP are adapted to the time-relevant characteristic electrical values specified for the signal pin with the semiconductor chip loaded with components; and an equivalent load circuit (ELC), formed by loading the ECP with passive components so that, when connected to the solder pad while the signal pin of the semiconductor chip is detached, the ELC simulates the time-relevant characteristic electrical values specified for the designated signal pin with the semiconductor chip loaded with components with the ELC not connected, whereby the time measurement can be performed at the solder pad connected to the ELC with the designated signal pin of the semiconductor chip detached.

9. The device of in claim 8, wherein the components of the ELC comprise resistive and/or capacitive and/or inductive components.

10. The device of claim 8, wherein the ECP is formed such that, in the loaded state, it establishes an electrical connection with a reference ground pad.

11. The device of claim 10, wherein the ECP further comprises:
  a first and a second longitudinal branch and a first and a second transverse branch, and a first, second, third and fourth solder pad belonging to the first longitudinal branch;
  a first, second, third and fourth solder pad belonging to the second longitudinal branch;
  a first and second solder pad belonging to the first transverse branch, wherein the first and second solder pad belonging to the first transverse branch are separated by a predetermined distance; and
  a first and second solder pad belonging to the second transverse branch, wherein the first and second solder pad belonging to the second transverse branch are separated by a predetermined distance.

12. The device of claim 11, wherein the first and second solder pads of the first longitudinal branch are arranged neighboring one another and separated by a predetermined distance,
  wherein the first and second solder pads of the second longitudinal branch are arranged neighboring one another and separated by a predetermined distance, and the third and fourth solder pads of the first longitudinal branch are arranged neighboring one another and separated by a predetermined distance,
  wherein the third and fourth solder pads of the second longitudinal branch are arranged neighboring one another and separated by a predetermined distance, and wherein the first and second solder pads of the second longitudinal branch are in each case arranged neighboring one another and separated by a predetermined distance.

13. The device of claim 12, wherein the first solder pad of the first longitudinal branch is connected via a piece of conductor attached to the solder pad associated with the designated signal pin,
  wherein the first solder pad of the second longitudinal branch is connected via a piece of conductor attached to the reference ground pad which carries a reference ground signal,
  wherein the second solder pad of the first longitudinal branch is connected to the third solder pad of the first longitudinal branch and the first solder pad of the first transverse branch via a piece of conductor,
  wherein the second solder pad of the second longitudinal branch is connected to the third solder pad of the second longitudinal branch and the second solder pad of the first transverse branch via a piece of conductor,
  and wherein the fourth solder pads of the first and second longitudinal branches, respectively are respectively connected to the first and second pads of the second transverse branch via a piece of conductor.

14. The method of claim 13, wherein the solder pads of the two longitudinal branches and the two transverse branches that are respectively neighboring one another at a predetermined distance are loaded with one of the components of the ELC.

15. The device of claim 8, wherein the semiconductor chip is a semiconductor memory chip that can be mounted using the ball-grid-array (BGA) technique.

16. A device for measuring signals at an input on a semiconductor chip module, comprising:
  an electrical conductor pattern (ECP) having a plurality of longitudinal and transverse branches;
  a plurality of electrical components, wherein the plurality of components are affixed to the ECP and form an equivalent load circuit (ELC); and
  a plurality of solder pads, wherein a first solder pad can be detachably connected to the input on the semiconductor chip module, and wherein a second solder pad can be reversibly connected to a ground reference input on the semiconductor module.

17. The device of claim 16, wherein the plurality of electrical components comprises resistive and/or inductive and/or capacitive components.

* * * * *

UNITED STATES PATENT AND TRADEMARK OFFICE
CERTIFICATE OF CORRECTION

PATENT NO. : 6,894,525 B2
DATED : May 17, 2005
INVENTOR(S) : Muff et al.

It is certified that error appears in the above-identified patent and that said Letters Patent is hereby corrected as shown below:

Column 7,
Line 17, delete "of in" and insert -- of --.

Signed and Sealed this

Sixteenth Day of August, 2005

JON W. DUDAS
*Director of the United States Patent and Trademark Office*